United States Patent
Kwok et al.

(10) Patent No.: US 9,018,512 B2
(45) Date of Patent: Apr. 28, 2015

(54) THERMOELECTRIC GENERATION SYSTEM

(75) Inventors: David W. Kwok, La Mirada, CA (US); James P. Huang, Huntington Beach, CA (US); John A. Skorupa, Huntington Beach, CA (US); John W. Smith, Buena Park, CA (US)

(73) Assignee: The Boeing Company, Chicago, IL (US)

( * ) Notice: Subject to any disclaimer, the term of this patent is extended or adjusted under 35 U.S.C. 154(b) by 747 days.

(21) Appl. No.: 12/050,849

(22) Filed: Mar. 18, 2008

(65) Prior Publication Data

US 2009/0159110 A1    Jun. 25, 2009

Related U.S. Application Data

(60) Provisional application No. 61/016,316, filed on Dec. 21, 2007.

(51) Int. Cl.
| | | |
|---|---|---|
| H01L 35/02 | (2006.01) | |
| H01L 35/30 | (2006.01) | |
| F02C 6/14 | (2006.01) | |
| F02C 6/18 | (2006.01) | |
| F02K 1/82 | (2006.01) | |
| F02C 6/00 | (2006.01) | |
| F02C 6/20 | (2006.01) | |
| H01L 35/00 | (2006.01) | |
| H01L 35/34 | (2006.01) | |
| F02C 6/08 | (2006.01) | |
| H01L 35/32 | (2006.01) | |

(52) U.S. Cl.
CPC . H01L 35/30 (2013.01); F02C 6/00 (2013.01); F02C 6/206 (2013.01); H01L 35/00 (2013.01); F02C 6/14 (2013.01); H01L 35/34 (2013.01); F02C 6/08 (2013.01); H01L 35/32 (2013.01); F02C 6/18 (2013.01); F02K 1/82 (2013.01); Y02T 50/671 (2013.01)

(58) Field of Classification Search
CPC ............. F02C 6/18; H01L 35/30; F02K 1/82; Y02T 50/671
USPC .................................................. 136/200, 205
See application file for complete search history.

(56) References Cited

U.S. PATENT DOCUMENTS

| | | | | |
|---|---|---|---|---|
| 5,386,689 | A * | 2/1995 | Bozich et al. ................... | 60/803 |
| 2004/0045594 | A1* | 3/2004 | Hightower .................... | 136/205 |
| 2005/0022855 | A1* | 2/2005 | Raver ............................ | 136/205 |
| 2007/0018038 | A1* | 1/2007 | Jarmon et al. .................. | 244/59 |

FOREIGN PATENT DOCUMENTS

WO    WO 0161768 A1 *  8/2001

* cited by examiner

*Primary Examiner* — Matthew Martin
(74) *Attorney, Agent, or Firm* — Haynes and Boone, LLP (57) ABSTRACT

A thermoelectric generation system for turbine engines and the like has at least one thermoelectric generator disposed proximate the turbine engine such that waste heat from the turbine engine can be converted into electricity. Vehicle performance and efficiency can be enhanced by mitigating the need for mechanically driven electric power generators, which undesirably drain power from the turbine engine thus adversely affect the vehicle's performance.

17 Claims, 7 Drawing Sheets

THERMOELECTRIC GENERATION SYSTEM

PRIORITY CLAIM

This patent application claims priority to U.S. patent application Ser. No. 61/016,316 filed Dec. 21, 2007 and entitled THERMOELECTRIC GENERATION SYSTEM FOR TURBINE ENGINES, which is incorporated herein by reference in its entirety.

TECHNICAL FIELD

The present invention relates generally to electrical circuits and, more particularly, to a thermoelectric generation system for turbine engines and the like.

BACKGROUND

Mechanically driven electric generators for aircraft engines, such as turbine engines, are well known. Such mechanically driven generators use electromagnetic induction to generate electricity. This is accomplished by extracting mechanical energy from moving parts of the engine.

Extracting mechanical energy reduces the amount of energy available for the primary purpose of the engine, which is typically to propel the aircraft forward. Thus, the use of such mechanically driven electric generators inherently reduces the efficiency of the engine.

Further, the use of such mechanically driven electric generators increases fuel consumption and consequently increases the costs associated with increase fuel consumption, wear, and maintenance. Increased fuel consumption creates increased pollution.

When an aircraft is initially designed, the electrical requirements for the aircraft are determined and electric generators are selected based upon those requirements. Generally, the smallest and lightest electric generators that fulfill the electrical requirements of the aircraft are selected. Thus, such electric generation systems do not typically have substantial spare capacity.

The life span of an aircraft can be several decades. During its life time, several iterations of avionics and electrical systems can occur. Many of these newer avionics and electrical systems find their way into older airframes, which have older electric generators. Upgrading avionics and installing new electrical devices can substantially increase the demand for electrical power. This increased demand can exceed the capacity of the installed electric generators.

In order to try to optimize aerodynamic efficiency, all of the systems in the turbine engine nacelle are packaged tightly. There is typically no room for the installation of additional or larger electric generators. Thus, upgrading to a larger electric generator can require costly modifications to the turbine engine and nacelle. Such modifications can include replacing the power extraction shaft, gearboxes, and mounting pad. In some instances, undesirable changes to the nacelle mold line are necessitated.

As such, there is a need for a way to generate electricity from a turbine engine or the like, which requires comparatively little space and thus necessitates comparatively little modification of the turbine engine.

SUMMARY

Systems and methods are disclosed herein to provide for the generation of electricity using thermoelectric generators (TEGs). More particularly, waste heat from turbine engines of aircraft can be converted into electrical power so as to mitigate the need for mechanically driven electric generators.

According to an example of an embodiment, a thermoelectric generation system comprises a turbine engine and at least one thermoelectric generator disposed proximate the turbine engine. The thermoelectric generator can be disposed proximate the turbine engine's core and/or nozzle so that heat from the turbine engine is provided to one surface of the thermoelectric generator. Airflow from a fan (such as the fan of a turbofan engine) and/or ambient airflow past the engine as the aircraft flies can be used to cool another surface of the thermoelectric generator.

According to an example of an embodiment, a method for generating electricity comprises heating a surface of a thermoelectric generator with heat from a turbine engine and cooling another surface of the thermoelectric generator. Again, one surface of the thermoelectric generator can receive heat from a core and/or nozzle of the turbine engine and another surface of the thermoelectric generator can be cooled with airflow from a fan (such as the fan of a turbofan engine) and/or ambient airflow past the engine as the aircraft flies.

One or more examples of embodiments mitigate the need for contemporary electrical generator assemblies, thus reducing vehicle weight and consequently enhancing performance and efficiency. Further, in some instances eliminating the need for bulky generator assemblies can reduce engine profile and thus reduce aerodynamic drag. Reducing or eliminating the use of mechanical electric power generating systems that are driven by the engine mitigates an undesirable source of power drain and consequently enhances engine performance.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 8 is a perspective view of a turbine engine (such as a turbojet engine, a turboprop engine, or a turboshaft engine)

having thermoelectric generators installed upon a nozzle cowling thereof, in accordance with an example of an embodiment;

Embodiments of the present invention and their advantages are best understood by referring to the detailed description that follows. It should be appreciated that like reference numerals are used to identify like elements illustrated in one or more of the figures.

DETAILED DESCRIPTION

A method and system for providing thermoelectric generation for turbine engines and the like are disclosed. According to an example of an embodiment, waste heat from a turbine engine is captured and converted into electric power. Thermoelectric generators (TEGs) can be used to capture and convert the waste heat into electric power. Thermoelectric generators can be advantageously placed at selected locations in a turbine engine so as to generate electric power.

Thus, rather than extracting mechanical power from an engine and then using the extracted mechanical power to create electric power, waste heat from the turbine engine can be used to generate electric power. As those skilled in the art will appreciate, the extraction of mechanical power from an engine to drive an electric generator inherently reduces the efficiency of the engine. Reducing the efficiency of an engine inhibits the ability of the engine to perform its primary function, e.g., to move a vehicle such as an aircraft.

Solid state thermoelectric generators can be used in place of or in addition to contemporary mechanically driven generators to generate electricity in turbine engines and the like. The thermoelectric generators can be used to provide primary power, secondary power, and/or backup power.

Contemporary electric generators are installed on an accessory pad of the turbine engine. They are connected to the turbine engine through a gearbox via a shaft that is connected to the main shaft of the turbine engine.

Thermoelectric generators generate electricity when they are disposed between two temperatures, thus providing a Δ Temperature. That is, thermoelectric generators generate electricity when one surface thereof is at a higher temperature than another surface thereof. Thus, a thermoelectric generator can be disposed between a heat source, e.g., a higher temperature region, and a cooling source, e.g., a lower temperature region or sink.

Figure 1:
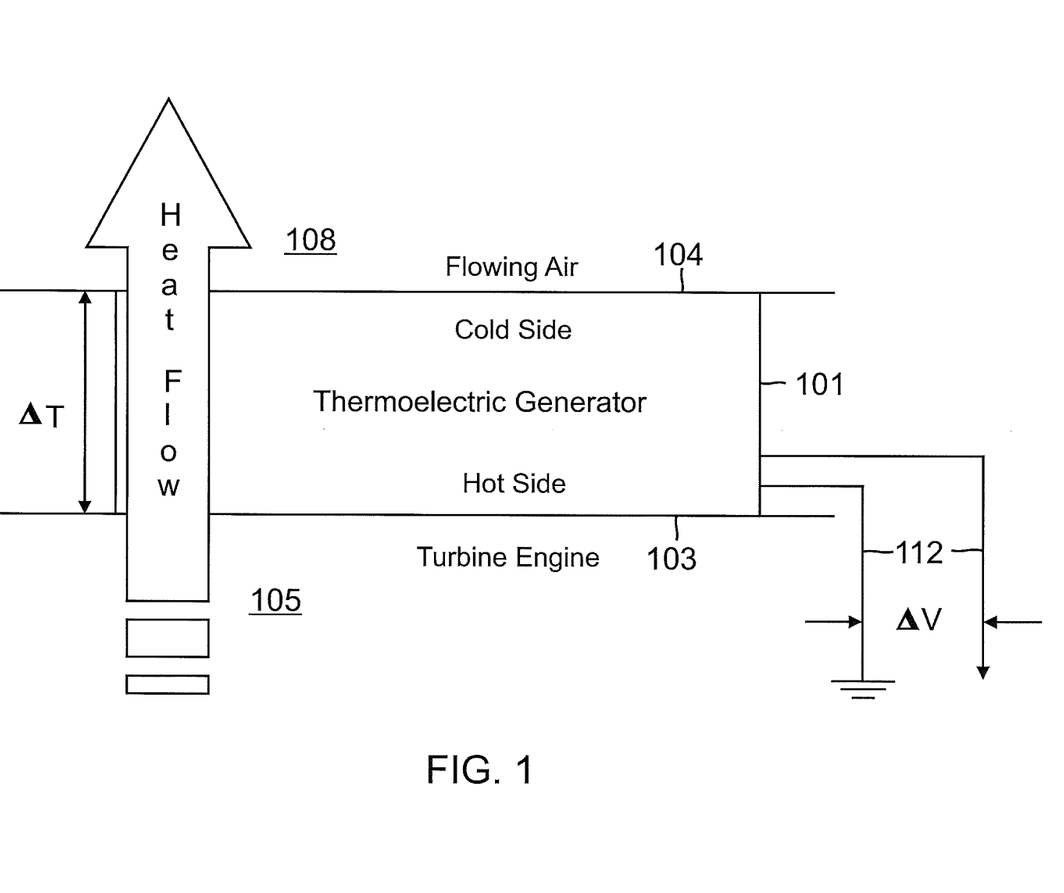
FIG. 1 is a block diagram illustrating the use of a thermoelectric generator (TEG) in accordance with an example of an embodiment.

Referring now to FIG. 1, the use of a thermoelectric generator 101 in accordance with an example of an embodiment is shown. One or more thermoelectric generators 101 can be installed at locations in a turbine engine where a higher temperature heat source and a lower temperature heat sink are readily available in close proximity to one another, e.g., separated by a compartment cowling or nozzle.

The thermoelectric generator 101 can be installed such that one side thereof, i.e., a hot side 103, receives heat from the turbine engine 105 and such that another side thereof, i.e., a cold side 104, provides heat to flowing air 108. The flow of heat through the thermoelectric generator 101 due to the difference in temperatures ΔT thereacross causes a voltage ΔV to be generated across terminals 112 of the thermoelectric generator 101.

Such use of one or more thermoelectric generators 101 to generate electricity can be very efficient, because it does not require mechanical work to be performed by the turbine engine. Rather, it uses waste heat that is produced by the turbine engine whether or not the thermoelectric generators 101 are present.

Examples of locations where thermoelectric generators 101 can be located on a turbine engine include proximate the turbine engine core cowling and proximate the turbine engine nozzle. Both of these locations provide a source of heat and a source of cooling. The source of heat is the hot gases of the turbine engine. The source of cooling is airflow.

For a turbine engine having a contemporary mechanically driven electric generator, an increase in electrical demand results in increased fuel consumption, higher exhaust temperatures, and increased air pollution. The air pollution typically includes carbon dioxide, nitrogen oxides, and upper-atmosphere water vapor.

However, such an increase in electrical demand does not result in increased fuel consumption, higher exhaust temperatures, and increased air pollution when using thermoelectric generators according to an example of an embodiment. Thermoelectric generators do not increase the load on the turbine engine when there is an increase in electrical demand. The thermoelectric generators generate electricity by capturing waste heat in the turbine engine compartment and/or nozzle. Thus, the efficiency of a turbine engine is not substantially reduced by the addition of thermoelectric generators and can be substantially improved by the elimination of mechanically driven electric generators.

Thermoelectric generators are solid state devices with no moving parts. They do not introduce substantially more heat into the turbine engine compartment. They are small and light in weight. They can be easily added to existing installations.

An example of an embodiment incorporates thermoelectric generators into a turbine engine of an aircraft such that the thermoelectric generators are strategically placed in desirable locations within the turbine engine compartment. The thermoelectric generators can be configured to provide all of the electric power for an aircraft and/or to provide additional electric power for the aircraft. Thermoelectric generators can be added to an aircraft without having to resort to expensive redesign of the turbine engine, generator, and other affected aircraft components.

Thermoelectric generators can be added to an aircraft without having to alter the proven aerodynamic design of an aircraft. As those skilled in the art will appreciate, altering the aerodynamic design of an aircraft can potentially adversely affect the aircraft's aerodynamic performance. Altering the aerodynamic design of an aircraft can also necessitate costly flight testing.

Examples of locations for thermoelectric generators in a turbine engine include the inside of the turbine engine core cowling and the inside of the core nozzle outside surface. At such locations, the thermoelectric generators are exposed to both hot and cold environments in close proximity to one another. That is, one surface of a thermoelectric generator is exposed to a comparatively hot environment, i.e., hot gases of the turbine engine, and another surface of the thermoelectric generator is exposed to a comparatively cold environment, i.e., airflow. Such locations fulfill the requirements for electrical power generation, while being protected from the undesirably high pressures and undesirably high velocity airflows normally found in turbine engines.

There are several types of turbine engines in common contemporary use. For example, turbofan, turbojet, turboprop, and turboshaft turbine engines are well known. Such turbine engines can be used to power aircraft, watercraft, and land vehicles. They can also be used for power generation and other purposes.

The turbofan engine achieves efficiency by bypassing a portion of the incoming airflow through a fan. The remainder of the incoming airflow is compressed and burned in a gas generator. A set of turbines is used to convert the thermal energy in the airflow to mechanical energy needed to power the fan. Both cooler fan airflow and hot core exhaust airflow are brought back together, either separately through a fan nozzle and a core nozzle or by being mixed internally into a single exhaust nozzle.

The bypass ratio of a turbofan engine is the ratio of airflow through the fan to that of the turbine engine core. An engine with a bypass ratio less than three is called a low bypass ratio engine and an engine with a bypass ratio greater than three is called a high bypass ratio engine.

Figure 2:
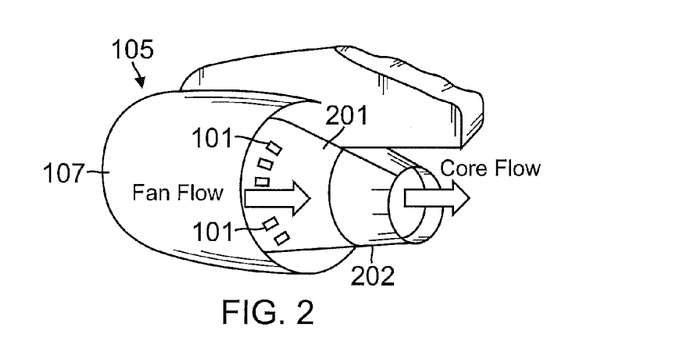
FIG. 2 is a perspective view of a turbofan engine having thermoelectric generators installed upon an engine core compartment thereof, in accordance with an example of an embodiment.
Figures 3, 4:
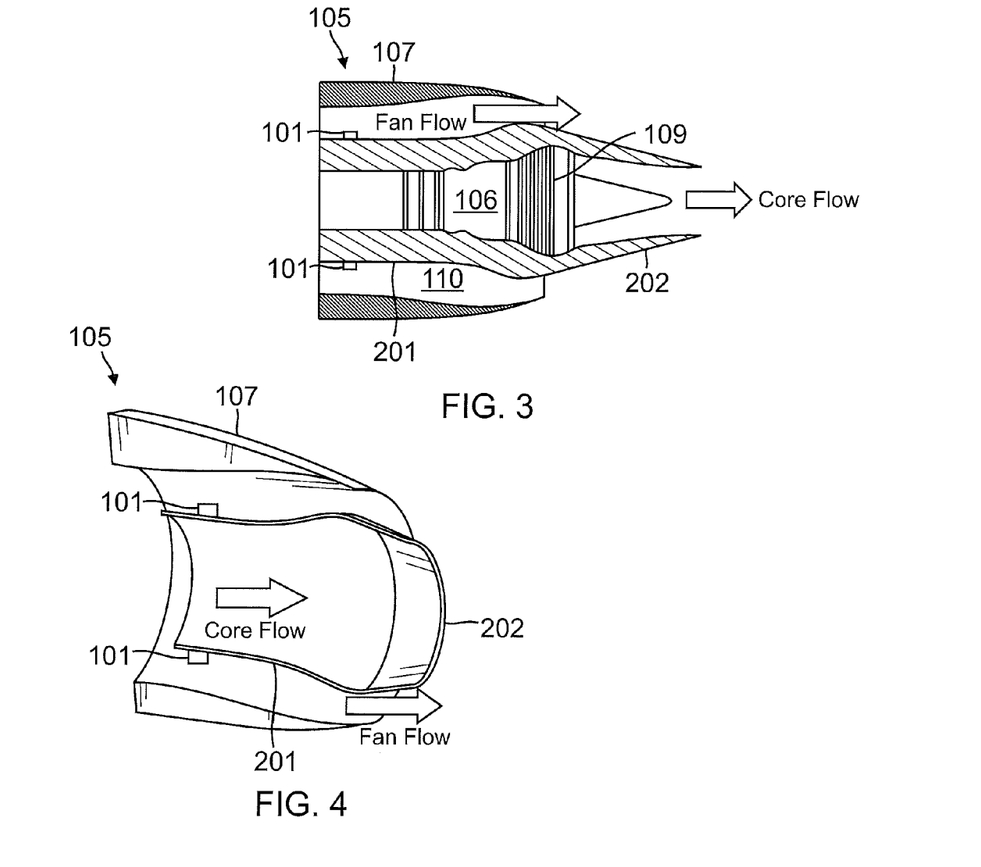
FIG. 3 is a cross-sectional view of the turbofan engine of FIG. 2, in accordance with an example of an embodiment.
FIG. 4 is a cross-sectional, perspective, enlarged view of the turbofan engine of FIG. 2, in accordance with an example of an embodiment.

Referring now to FIGS. 2-4, an example of a location for placement of the thermoelectric generators 101 is upon the engine core cowling 201 of a turbofan engine 105. In a typical turbofan engine 105, the core compartment is the space between the turbine engine core 106 (FIG. 3) and the fan duct cowling 107 where the turbo-machinery and gas generator are located. The fan duct 110 is where accelerated airflow from the fan is transported to the fan nozzle.

Within the engine core 106 are the engine turbines 109, as well as engine sub-system components such as bleed, fuel, and electrical systems. The engine core 106 is very hot because it contains the burners of the turbine engine 105 where combustion takes place, as well as high-temperature components such as the turbines 109 where the energy from the high-temperature gas is converted into mechanical work.

The engine core 106 is separated from a fan duct 110 by a thin wall or core compartment cowling 201. The core compartment cowling 201 defines the inner surface of the fan duct 110. An outer or fan duct cowling 107 defines the outer surface of the fan duct 110. Part or the entire length of the core compartment 201 may be insulated.

According to an example of an embodiment, thermoelectric generators 101 are installed on an inside surface of an outside wall of the core compartment cowling 201. The thermoelectric generators 101 can be located upon the inside (facing the engine core 106) surface of the core compartment cowling 201 or can be located upon the inside (facing the fan duct cowling 107) surface of the core compartment cowling 201. In either instance, the hot side of the thermoelectric generators 101 faces the hot engine core 106 and the cold side of the thermoelectric generators 101 faces the fan duct 110.

Locations along the fan duct 110 where the generators are installed can be determined by temperature differences between the engine core 106 and the fan duct 110. Greater temperature differences provide greater electric power generation efficiency.

Figure 5:
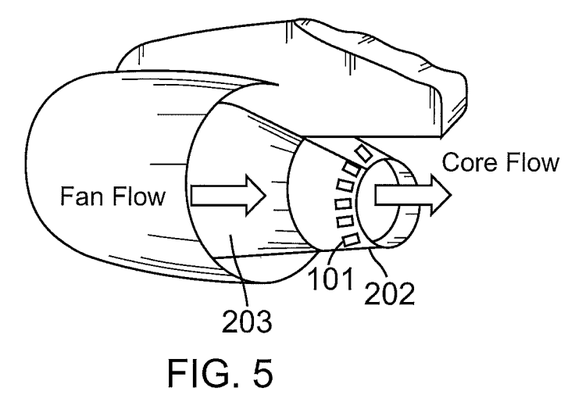
FIG. 5 is a perspective view of a turbofan engine having thermoelectric generators installed upon an engine core nozzle thereof, in accordance with an example of an embodiment.
Figure 6:
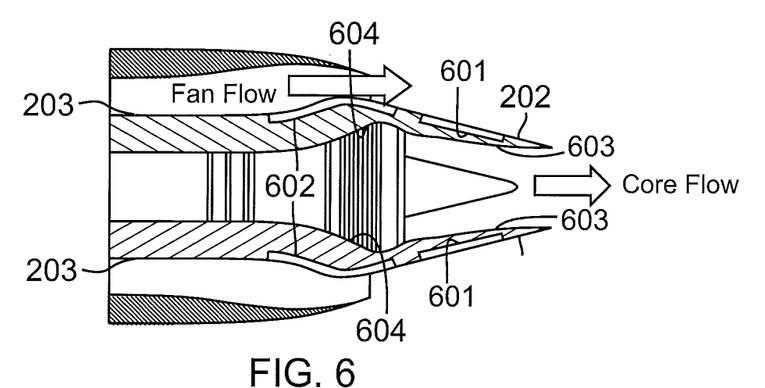
FIG. 6 is a cross-sectional view of the turbofan engine of FIG. 5, in accordance with an example of an embodiment.
Figure 7:
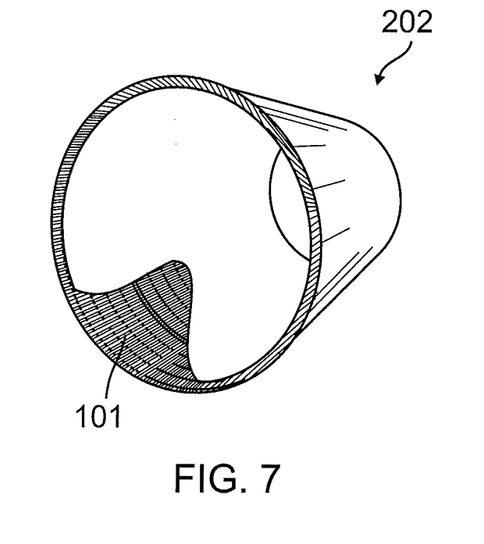
FIG. 7 is a cross-sectional, perspective, enlarged view of the core nozzle of FIG. 5, in accordance with an example of an embodiment.

Referring now to FIGS. 5-7, an example of a location for placement of the thermoelectric generators 101 is upon the engine core nozzle 202 of a turbofan engine 105. For example, the thermoelectric generators 101 can be installed on either the inner surface or the outer surface of the core nozzle 202. The core nozzle 202 is the tailpipe of the gas generator in the turbine engine 105. The inside of the core nozzle 202 is shaped to maximize thrust from the hot post-combustion exhaust gas. Outside of the core nozzle 202 is shaped to maximize thrust from the fan exhaust gas.

Although FIG. 5 shows the thermoelectric generators 101 less densely packaged about the core nozzle 202, the thermoelectric generators 101 can be substantially more densely packaged as shown in FIG. 7.

The core nozzle 202 is typically constructed from two sheets of metal that are separated by an air gap. The sheets of metal converge at the end of the core nozzle 202 to form a sharp trailing edge so as to mitigate base drag. They are typically not attached to each other and are free to move independently to account for the larger thermal expansion from the inner or hotter piece.

Figure 14:
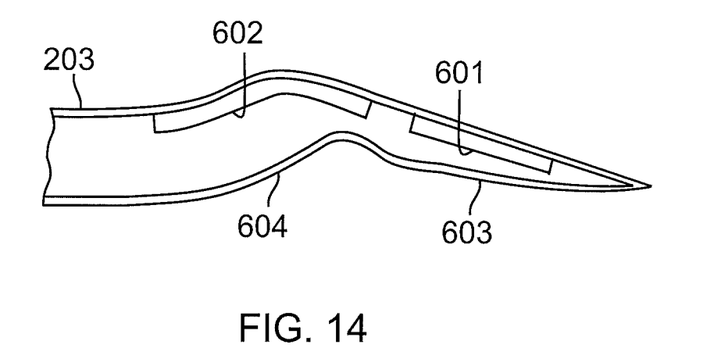
FIG. 14 is an enlarged cross-section of an engine cowling and/or core nozzle showing placement of thermoelectric generators on an inner surface of an outer wall thereof.

With particular reference to FIG. 5, the thermoelectric generators 101 can be installed on the inside surface of the outer nozzle wall 202 and/or on the inside surface of the outer cowling wall 203. Examples of areas where the thermoelectric generators 101 can be installed include area 601 on the inside surface of the outer nozzle wall 202 and area 602 on the inside surface of the outer cowling wall 203. Those skilled in the art will appreciate that the thermoelectric generators 101 can be installed at other locations on or proximate a turbine engine. Such construction is also shown in FIG. 14.

Thermoelectric generators 101 installed on the inside surface of the outer nozzle wall 202 and on the inside surface of the outer cowling wall 203 receive heat from the hot exhaust gases of the turbine engine. The heat of the exhaust gases is transmitted to the inner wall 603 of the core nozzle by convection, is conducted through the inner wall 603 of the core nozzle, and then is radiated to the thermoelectric generators 101. The heat is carried away from the thermoelectric generators 101 by convection that effected by the flow of comparatively cool bypass air thereover.

The temperature difference between the core exhaust and fan air flow is very great. A substantial portion of the surface area of the inside of the core nozzle 202 can be used to mount thermoelectric generators 101.

Examples of embodiments can be used on turbojet, turboprop, and turboshaft turbine engines. The difference between a turbofan engine with respect to a turbojet, a turboprop, or a turboshaft engine is that the latter turbine engines do not have a fan bypass in the turbine engine. All of the inlet airflow goes through the compressor and turbines of the turbine engine.

For turbojet, turboprop, or turboshaft engines, there is no fan air stream in the turbine engine. Therefore, ambient airflow can be used instead of the fan air stream for providing cooling to the thermoelectric generator.

Figure 8:
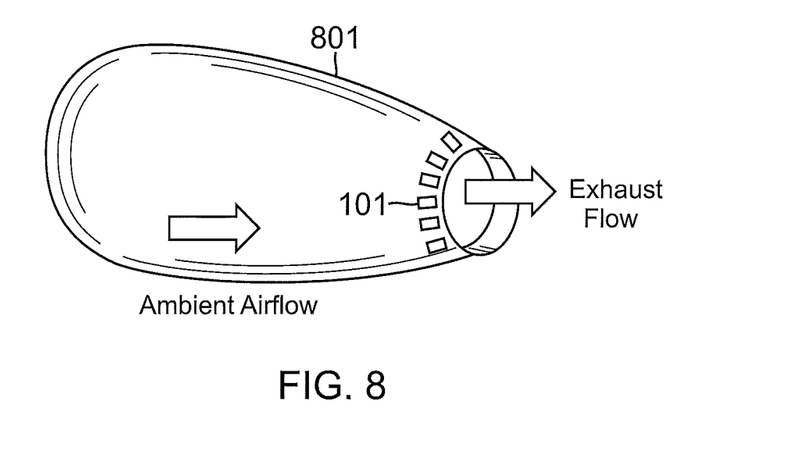
Figure 9:
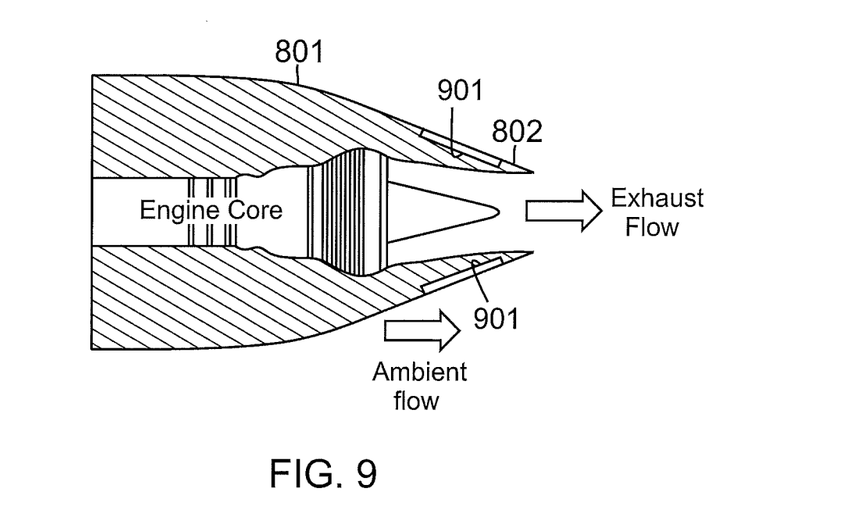
FIG. 9 is a cross-sectional view of the turbine engine of FIG. 8, in accordance with an example of an embodiment.

Referring now to FIGS. 8 and 9, ambient airflow is available on the outside of the turbine engine cowling 801 for cooling the cold side of the thermoelectric generators 101. The thermoelectric generators 101 can be disposed upon either the inside or the outside of the engine cowling 801. For example, the thermoelectric generators 101 can be disposed in area 901 proximate the exhaust port 802 of the turbine engine cowling 801.

Thermoelectric generators 101 can be less than one square inch in size. Compared to a turbine engine, they are very small. In order to mitigate manufacturing, installation, retrofitting and maintenance costs, thermoelectric generators can be installed in groups, such as modules.

Figure 10:
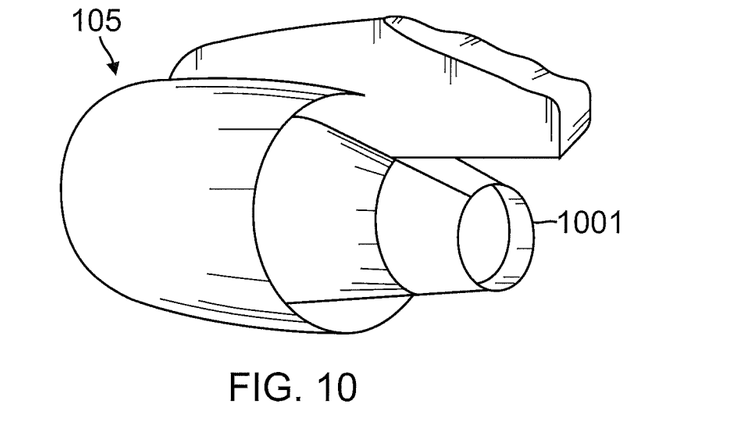
FIG. 10 is a perspective view of a turbofan engine having thermoelectric generators installed upon readily removable nozzle cowling panels thereof, in accordance with an example of an embodiment.
Figure 11:
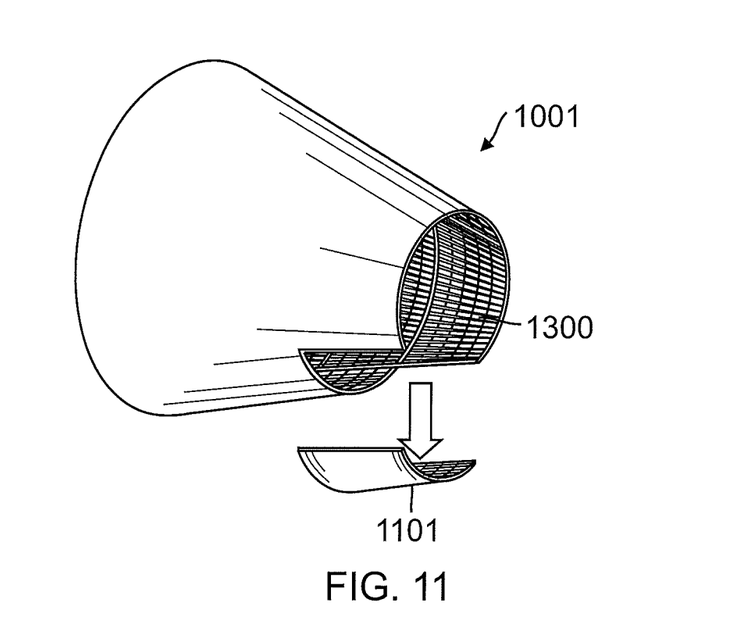
FIG. 11 is an enlarged perspective view of the nozzle cowling of FIG. 10, showing the panels thereof, in accordance with an example of an embodiment.

Referring now to FIGS. 10 and 11, thermoelectric generator modules 1300 can be provided according to an example of an embodiment. To make manufacturing, installation, retrofitting, and/or maintenance more efficient, a plurality of thermoelectric generators 101 can be packaged so as to define a single module 1300. Thus, a module is a structure that comprises a plurality of thermoelectric generators 101. A plurality of such modules 1300 can be installed upon a single turbine engine 105.

An inner wall 1302 can cover the modules 1300 and protect the modules and associated wiring from hot exhaust gases. The inner wall 1302 is not shown in FIG. 11 and is shown in FIG. 13.

Such modules 1300 can be built up into panels 1101. Thus, each panel comprises a plurality of modules 1300. Panels 1101 can be configured so as to be handled easily by a single person.

Figure 12:
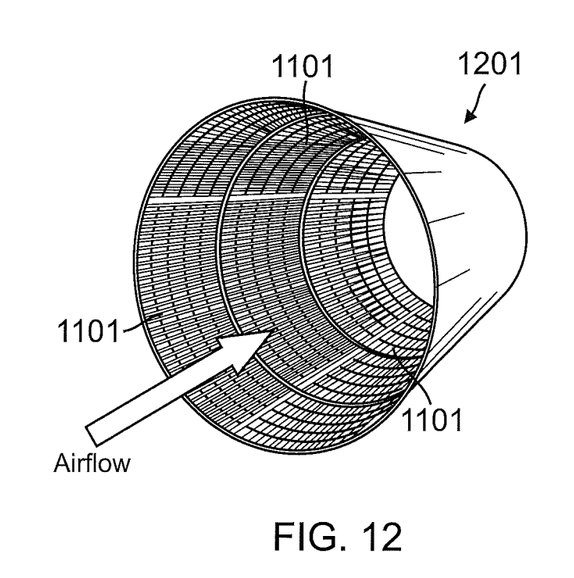
FIG. 12 is an enlarged perspective view of a panel for a mid thrust high bypass ratio turbofan engine core nozzle having thermoelectric generators installed thereon, in accordance with an example of an embodiment.

Referring now to FIG. 12, a plurality of such panels 1101 can be used to construct a turbine engine nozzle 1001, for example. Similarly, a plurality of such panels 1101 can be used to construct a core compartment cowling 201 or other structure. For example, a typical mid-thrust high-bypass ratio engine nozzle may employ twelve such panels 1101. Such panels 1101 can define three fore-and-aft sections by four quadrants, for example.

Figure 13:
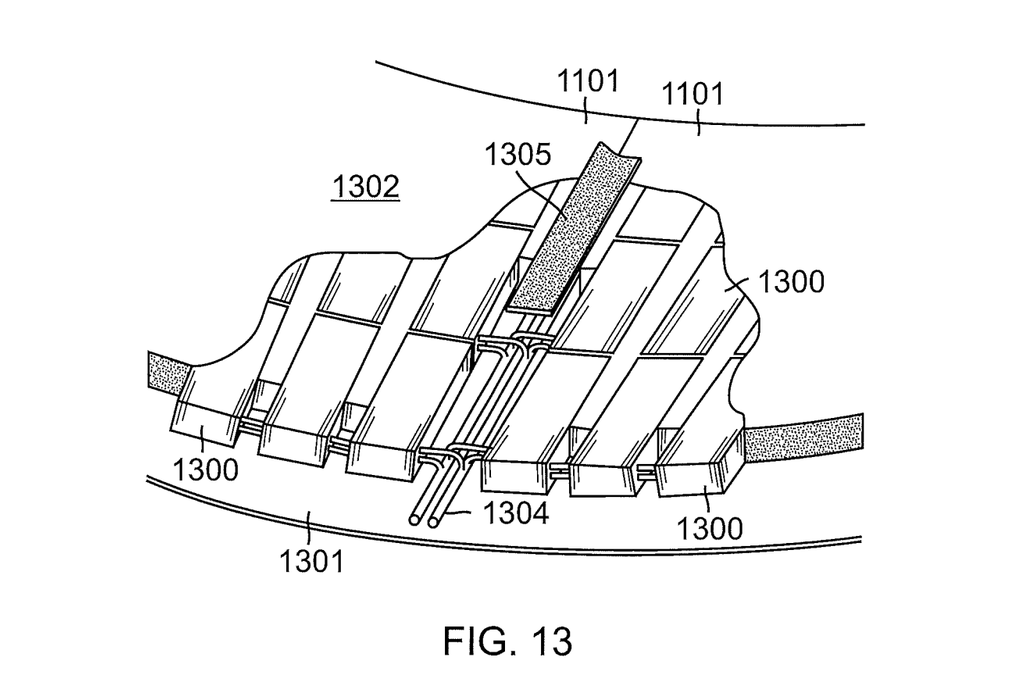
FIG. 13 is an enlarged perspective cutaway view of a panel having thermoelectric generators/modules installed thereon, in accordance with an example of an embodiment.

Referring now to FIG. 13, a cutaway of an example of thermoelectric generator installation is shown at a seam where two thermoelectric generator panels 1101 are joined. Individual thermoelectric generators modules/thermoelectric generators 1300 can be sandwiched between a cold-side base material 1301 and a hot-side base material 1302. Reference number 1300 can designate either an individual thermoelectric generator or a thermoelectric generator module.

The thermoelectric generators/modules 1300 and base material joints can be constructed using brazing, for example. Those skilled in the art will appreciate that other construction methods are likewise suitable. For example, adhesive bonding and/or fasteners can be used.

Gaps between adjacent thermoelectric generators/modules 1300 can be filled with an insulating material 1305 to inhibit heat transfer between the hot side and the cold side. Heat transfer between the two sides other than heat transfer through the thermoelectric generators/modules 1300 tends to decrease the temperature difference needed for electricity generation using the thermoelectric generators/modules 1300.

Main power bus 1304 can extend along each panel 1101 to carry the generated electricity to a power junction box or the like on the turbine engine. For a four quadrant configuration, only two junction boxes on the turbine engine are generally required. Power generated by each thermoelectric generator/module 1300 can be transferred by a small network of wires to the main power wire or bus 1304. The panels 1101 can be attached to the turbine engine frame and to each other using standard installation methods, such as the use of fasteners. Each seam can sealed by an insulating seal.

Thermoelectric generators can provide DC current without the need for AC power converters. This provides the potential to design aircraft electrical systems that are lighter, more compact, more fuel efficient, safer, and more reliable.

The DC power generated by thermoelectric generators can be substantially cleaner (have less noise or other undesirable characteristics) than conventional aircraft DC power, which is typically generated by rectifying 3-phase AC power. The current process of rectifying sinusoidal AC power results in truncating and patching wave forms to approximate DC power. The process typically results in an imperfect approximation that then imposes a burden on every piece of avionics equipment to clean up the current for use on its own circuitry. Thermoelectric generators can provide clean DC power which mitigates the burden on avionics equipment, improve avionics system reliability and failure rates, and ultimately can eliminate the need for aircraft current rectifying systems.

The power collection network within an engine compartment can be a distributed or mesh power bus-like design, e.g., with a local power line collecting power from multiple thermal-electric generation modules and the power collected by the set of local power collecting lines would be summed up by an engine level power line. The turbine engine level power line, typically using only two wires (i.e., positive and negative/ground) feeds power to aircraft internal power management system, which in turn manages aircraft level power loads (i.e., such as avionics boxes, compressors, fans, etc.). This can be very similar to how power is collected from a solar array.

The use of these generators will reduce the size of the traditional electrical generators or may eliminate them completely. Generator size reduction and elimination will reduce weight and purchase cost. Total elimination will reduce vehicle maintenance cost and increase reliability.

Because of the rapid change in avionics and other electrical systems, power requirement for an existing airframe increases substantially over its lifetime. Upgrading a traditional electric generator is expensive and sometimes impossible due to space limitation. Installation and integration of one or more embodiments is simple, particularly for supplementary power. Majority of the system resides in an externally accessible location. Upgrade can be performed during a regular scheduled maintenance shop visit.

In operation, electricity is generated as soon as heat is available to the generators. The power generated from these generators will be first used by the power-consuming systems. Power from the traditional generator will not be needed until the system demand is greater than what is produced by the thermoelectric generators. Until the traditional generator starts generating power, electricity generated from wasted heat using these generators will not require any fuel burn.

Thermoelectric generators disposed proximate the core and/or nozzle of a turbine engine can be exposed to delta temperatures of approximately 800° F. Such delta temperatures can produce enough electrical power to eliminate the need for mechanical generators that are typically used on the turbine engines.

The need for contemporary mechanically driven electrical generator assemblies is mitigated. Fewer and/or smaller mechanically driven electrical generator assemblies can be used. Indeed, in some instances, mechanically driven electrical generator assemblies can be eliminated altogether. Eliminating the use of a mechanical electric power generating system that is driven by the engine eliminates an undesirable source of power drain and consequently enhances engine performance. Eliminating the use of a mechanical electric power generating system also reduces the overall weight of a vehicle. Vehicle weight reduction results in enhanced performance and efficiency.

In situations where greater electrical output is required, one or more embodiments can augment existing generators to provide additional or redundant power.

In some instances, eliminating the need for bulky generator assemblies can reduce engine profile and thus reduce aerodynamic drag. This is particularly important in those instances where the engine wherein the engine is located within a nacelle that is external to the vehicle, such as the turbine engines of many jet aircraft. In these instances, the overall size of the turbine engine can be reduced, thus reducing the size of the nacelle.

Further, according to one or more embodiments, at least some of the electrical requirements of an aircraft can be provided using a cleaner energy source than is provided by contemporary methodology. This not only benefits the environment, but also facilitates the use of avionics equipment without filters and mitigates the need to protect onboard equipment from damage.

Methods and systems disclosed herein can be use with various different types of turbine engines. For example, such methods and systems can be used with turbofan engines, turbojet engines, turboprop engines and turboshaft engines. Further, the methods and system disclosed herein are not limited to use only with aircraft turbine engines. For example, such methods and systems can also be used with marine, automobile, and stationary turbine engines.

The use of turbine engines herein is by way of example only, and not by way of limitation. Those skilled in the art will appreciate that the methods and systems disclosed herein can similarly be used in non-turbine engines such as internal combustions engines, steam engines, and rocket engines. Indeed, the methods and system disclosed herein can generally be used with any type of engine that produces waste heat.

Embodiments described above illustrate but do not limit the invention. It should also be understood that numerous modifications and variations are possible in accordance with the principles of the present invention. Accordingly, the scope of the invention is defined only by the following claims.

The invention claimed is:

1. A turbine engine thermoelectric generation system comprising:
 a turbine engine;
 a turbine engine nacelle including an engine cowling for housing the turbine engine and an engine nozzle;
 a plurality of modules disposed on at least one of the engine cowling and the engine nozzle, wherein each module includes a plurality of thermoelectric generators; and
 one or more panels each comprising an inner wall adjacent a heat source of the turbine engine, an outer wall adjacent a bypass fan air flow duct, and at least one of the modules disposed between and in contact with the inner wall and the outer wall, wherein:
  each thermoelectric generator includes two surfaces, one surface being adjacent to the inner wall and the heat source and the other surface being adjacent to the outer wall and the bypass fan air flow duct, and
  the one or more panels comprise a distributed mesh of local power collecting lines configured to transfer power generated by the modules and/or thermoelectric generators within each panel to a turbine engine level power line for the turbine engine.

2. The thermoelectric generation system as recited in claim 1, wherein the thermoelectric generators comprise solid state thermoelectric generators.

3. The thermoelectric generation system as recited in claim 2, wherein the turbine engine is configured to facilitate flight of an aircraft.

4. The thermoelectric generation system as recited in claim 1, wherein the thermoelectric generators are configured as a primary power source and/or a secondary power source for an aircraft.

5. The thermoelectric generation system as recited in claim 1, wherein:
 for each panel, the distributed mesh of local power collecting lines comprise a network of pairs of wires connecting adjacent ones of the modules and/or thermoelectric generators to each other and/or to the turbine engine level power line for the turbine engine; and
 the one or more panels are brazed, adhesively bonded, and/or fastened to each other to form the engine nozzle and/or a substantially cylindrical section of the engine cowling.

6. A turbine engine thermoelectric generation system comprising:
 a turbine engine;
 a turbine engine nacelle housing the turbine engine; and
 at least one module disposed on the engine nacelle or in a core nozzle within the nacelle, wherein the at least one module includes a plurality of thermoelectric generators; and
 one or more panels each comprising an inner wall adjacent a heat source of the turbine engine, an outer wall adjacent a bypass fan air flow duct, and at least one of the thermoelectric generators disposed between and in contact with the inner wall and the outer wall, wherein:
  each thermoelectric generator includes two surfaces, one surface being adjacent to the inner wall and the heat source and the other surface being adjacent to the outer wall and the bypass fan air flow duct, and
  the one or more panels comprise a distributed mesh of local power collecting lines configured to transfer power generated by the modules and/or thermoelectric generators within each panel to a turbine engine level power line for the turbine engine.

7. The thermoelectric generation system as recited in claim 6, wherein the thermoelectric generators comprise solid state thermoelectric generators.

8. The thermoelectric generation system as recited in claim 6, wherein the turbine engine is configured to facilitate flight of an aircraft.

9. The thermoelectric generation system as recited in claim 6, wherein the thermoelectric generators are configured as a primary power source and/or a secondary power source for an aircraft.

10. The thermoelectric generation system as recited in claim 6, wherein:
 for each panel, the distributed mesh of local power collecting lines comprise a network of pairs of wires connecting adjacent ones of the modules and/or thermoelectric generators to each other and/or to the turbine engine level power line for the turbine engine; and
 the one or more panels are brazed, adhesively bonded, and/or fastened to each other to form the core nozzle and/or a substantially cylindrical section of the engine nacelle.

11. The thermoelectric generation system as recited in claim 6, wherein the at least one module is disposed within the engine nacelle forward of at least one turbine of the turbine engine.

12. The thermoelectric generation system as recited in claim 6, wherein the at least one module comprises a plurality of modules, and wherein one or more gaps between adjacent ones of the modules and/or thermoelectric generators in the one or more panels are filled with a thermally insulating material to inhibit heat transfer between the heat source of the turbine engine and a bypass fan air flow in the bypass fan air flow duct.

13. The thermoelectric generation system as recited in claim 1, wherein the plurality of modules are disposed within the engine cowling forward of at least one turbine of the turbine engine.

14. The thermoelectric generation system as recited in claim 1, wherein one or more gaps between adjacent ones of the modules and/or thermoelectric generators in the one or more panels are filled with a thermally insulating material to inhibit heat transfer between the heat source of the turbine engine and a bypass fan air flow in the bypass fan air flow duct.

15. A turbine engine thermoelectric generation system comprising:
  a turbine engine;
  a turbine engine nacelle including an engine cowling for housing the turbine engine and an engine nozzle; and
  a plurality of modules disposed on the engine cowling forward of at least one turbine of the turbine engine, wherein each module includes a plurality of thermoelectric generators; and
  one or more panels each comprising an inner wall adjacent a heat source of the turbine engine, an outer wall adjacent a bypass fan air flow duct, and at least one of the modules disposed between and in contact with the inner wall and the outer wall, wherein:
    each thermoelectric generator includes two surfaces, one surface being adjacent to the inner wall and the heat source and the other surface being adjacent to the outer wall and the bypass fan air flow duct, and
    the one or more panels comprise a distributed mesh of local power collecting lines configured to transfer power generated by the modules and/or thermoelectric generators within each panel to a turbine engine level power line for the turbine engine.

16. The thermoelectric generation system as recited in claim 15, wherein gaps between adjacent ones of the modules and/or thermoelectric generators in the one or more panels are filled with a thermally insulating material to inhibit heat transfer between the heat source of the turbine engine and a bypass fan air flow in the bypass fan air flow duct.

17. The thermoelectric generation system as recited in claim 15, wherein:
  for each panel, the distributed mesh of local power collecting lines comprise a network of pairs of wires connecting adjacent ones of the modules and/or thermoelectric generators to each other and/or to the turbine engine level power line for the turbine engine; and
  the one or more panels are brazed, adhesively bonded, and/or fastened to each other to form the core nozzle and/or a substantially cylindrical section of the engine nacelle.

* * * * *